United States Patent
Shim et al.

[11] Patent Number: 5,943,584
[45] Date of Patent: Aug. 24, 1999

[54] ANNEALING METHODS OF DOPING ELECTRODE SURFACES USING DOPANT GASES

[75] Inventors: Se-jin Shim, Seoul; You-chan Jin, Kyungki-do; Seung-hee Nam, Seoul, all of Rep. of Korea

[73] Assignee: Samsung Electronics Co., Ltd., Rep. of Korea

[21] Appl. No.: 08/976,338

[22] Filed: Nov. 21, 1997

[30] Foreign Application Priority Data

Nov. 22, 1996 [KR] Rep. of Korea .................. 96-56789

[51] Int. Cl.⁶ ............................................. H01L 21/8242
[52] U.S. Cl. ........................................ 438/398; 257/309
[58] Field of Search ............................ 438/253, 386, 438/396, 626, 660, 3, 397, 398, 399; 257/309

[56] References Cited

U.S. PATENT DOCUMENTS

| | | | |
|---|---|---|---|
| 5,234,862 | 8/1993 | Aketagawa et al. | 438/488 |
| 5,366,917 | 11/1994 | Watanabe et al. | 438/398 |
| 5,372,962 | 12/1994 | Hirota et al. | 438/398 |
| 5,385,863 | 1/1995 | Tatsumi et al. | 438/398 |
| 5,394,012 | 2/1995 | Kimura | 257/739 |
| 5,405,801 | 4/1995 | Han et al. | 438/386 |
| 5,464,791 | 11/1995 | Hirota | 438/253 |
| 5,486,488 | 1/1996 | Kamiyama | 438/396 |
| 5,543,347 | 8/1996 | Kawano et al. | 438/660 |
| 5,554,557 | 9/1996 | Koh | 438/396 |
| 5,567,637 | 10/1996 | Hirota | 438/593 |
| 5,590,051 | 12/1996 | Yokozawa | 364/496 |
| 5,595,937 | 1/1997 | Mikagi | 438/626 |
| 5,616,511 | 4/1997 | Hirota | 438/396 |
| 5,623,243 | 4/1997 | Watanabe et al. | 257/309 |
| 5,646,061 | 7/1997 | Wang et al. | 438/396 |
| 5,670,404 | 9/1997 | Dai | 438/228 |
| 5,753,559 | 5/1998 | Yew et al. | 438/398 |
| 5,770,500 | 6/1998 | Batra et al. | 438/255 |
| 5,792,689 | 8/1998 | Yang et al. | 438/253 |

FOREIGN PATENT DOCUMENTS 4-286151 10/1992 Japan .

OTHER PUBLICATIONS

H. Watanabe et al., Hemispherical Grained Silicon (HSG–Si) Formation on In–Situ Phosphorus Doped Amorphous–Si Using The Seeding Method, Extended Abstracts of the 1992 International Conference on Solid State Devices and Methods, Tsukuba, Aug. 26–28, 1992, pp. 422–424.

H. Watanabe et al., A New Cylindrical Capacitor Using Hemispherical Grained Si (HSG–Si) for 256Mb DRAMs, 1992 IEEE, IEDM 92, 10.1.1–10.1.4, pp. 259–262.

*Primary Examiner*—Olik Chaudhuri
*Assistant Examiner*—William David Coleman
*Attorney, Agent, or Firm*—Myers Bigel Sibley & Sajovec

[57] ABSTRACT

A method of doping a surface portion of a layer of an integrated circuit device includes the steps of forming a layer of a semiconductor material on an integrated circuit substrate and annealing the layer of the semiconductor material at a predetermined temperature while flowing a dopant gas over the layer of the semiconductor material. More particularly, the step of forming the layer of the semiconductor material can include forming a first sub-layer of the semiconductor material on the integrated circuit substrate and forming a second sublayer of the semiconductor material on the first sublayer where the second sublayer has an increased surface area. For example, the second sublayer can be a hemispherical grained silicon layer.

21 Claims, 4 Drawing Sheets

ANNEALING METHODS OF DOPING ELECTRODE SURFACES USING DOPANT GASES

FIELD OF THE INVENTION

The present invention relates to the field of integrated circuits and more particularly to methods of doping integrated circuit layers.

BACKGROUND OF THE INVENTION

As dynamic random access memory devices become more highly integrated, space available for each memory cell is reduced, and more particularly, the space available for each memory cell capacitor is reduced. The capacitance C of a memory cell capacitor is proportional to the surface area A of the opposing electrodes, and proportional to the dielectric constant $\epsilon$ of the dielectric layer between the opposing electrodes. The capacitance C of the memory cell capacitor is inversely proportional to the distance d between the opposing electrodes. These mathematical relationships are shown in the following formula:

$$C = \epsilon \frac{A}{d}$$

As the area available for a capacitor decreases with increasing integration densities, the surface area A of the opposing electrodes may be reduced thereby reducing the capacitance of the memory cell capacitor. Reductions in memory cell capacitance, however, may reduce the performance of the integrated circuit memory device. Accordingly, there exists a need to maintain a predetermined memory cell capacitance despite reductions in memory cell capacitor size.

Three basic techniques have been developed to increase memory cell capacitance without increasing the size of the memory cell capacitor. First, the dielectric layer between the opposing electrodes can be made thinner. Second, a dielectric material such as BST(Ba(Sr,Ti)O$_3$) or PZT (Pb(Zr,Ti)O$_3$) having a relatively high dielectric constant can be provided between the opposing electrodes. Third, the surface area of the opposing electrodes can be increased. The use of thinner capacitor dielectric layers, however, may result in increased leakage currents, and dielectric materials such as BST and PZT may not yet be commercially viable. Some progress, however, has been made by providing structures for increasing the surface area of the opposing electrodes without increasing the area occupied by the capacitor.

In particular, electrode surface areas have been increased by forming hemispherical grained (HSG) silicon layers on the surface of the lower capacitor electrode. As shown in FIG. 1, however, the use of hemispherical grained silicon layers may cause an increase in a ratio between a minimum capacitor capacitance (Cmin) and a maximum capacitance (Cmax) that is significantly lower than 1. In FIG. 1, the reference symbols ●, ■, ▲, ▼, and ♦ indicate the capacitances measured respectively at the top, center, bottom, left, and right portions of the capacitor.

As shown, the capacitance has a minimum value Cmin of about 45 pF when approximately −2 V is applied. The capacitance has a maximum value Cmax of approximately 60 pF to 65 pF when about 2 V is applied. The Cmin/Cmax ratio is thus about 0.72 (45/62.5), which is significantly less than 1. The operation of the capacitor may thus be unstable, and the reliability of the integrated circuit memory device may be reduced.

When forming a hemispherical grained silicon layer, it may be desirable to selectively form the hemispherical grained silicon layer on the electrodes without forming the HSG layer on the exposed portions of the insulating layer. It may also be desirable to reduce leakage current, and to increase the Cmin/Cmax ratio. Selective growth and reduced leakage current can be provided by increasing process margins. It may be difficult, however, to increase the Cmin/Cmax ratio.

The Cmin/Cmax ratio can be increased by controlling the doping concentrations of the upper and lower capacitor electrodes and by increasing the dopant concentration of the lower capacitor electrode having the hemispherical grained silicon layer. It may not be easy, however, to vary the dopant concentrations of the upper and lower electrodes of the capacitor because a plate-poly used for the upper electrode may also be used to provide a resistor in a peripheral circuit region. In addition, increasing the doping concentration of the lower electrode may influence a bit line contact resistance and a transistor.

A conventional method of forming a hemispherical grained silicon layer is discussed in the reference by Watanabe et al. entitled "Hemispherical Grained Silicon (HSG-Si) Formation On In-Situ Phosphorous Doped Amorphous-Si Using The Seeding Method." Solid State Device and Materials, 1992, pp. 422–424. In this reference, the hemispherical grained silicon layer is doped by direct ion implantation. The hemispherical grained silicon layer is formed by a seeding method.

As shown in FIG. 2, an insulating layer 12 is formed on a semiconductor substrate 10, and a contact hole 14 is formed in the insulating layer 12. Moreover, a memory cell access transistor can be formed on the substrate 10 prior to forming the insulating layer 12, and the contact hole through the insulating layer 12 can expose a source/drain region of the memory cell access transistor. A lower capacitor electrode 16 is formed on the insulating layer 12 and coupled to the semiconductor substrate 10 through the contact hole 14. The lower capacitor electrode 16 is formed from undoped amorphous silicon (a-Si).

Disilane (Si$_2$H$_6$) molecules are then irradiated onto the surface of the lower capacitor electrode 16 at a temperature of approximately 580° C. thereby forming HSG seeds 18 as shown in FIG. 3. These seeds 18 can be used to form a hemispherical grained silicon layer on the lower capacitor electrode 16. The structure is then annealed at the same temperature thus causing the seeds 18 to grow. The seeds 18 are then grown to form a hemispherical grained silicon layer 20 on the lower capacitor electrode 16 as shown in FIG. 4.

The lower capacitor electrode 16 and the HSG silicon layer 20, however, may be undoped. Both the lower capacitor electrode 16 and the HSG silicon layer 20 can be doped by implanting arsenic (As) onto the surface of the structure including the lower capacitor electrode 16, the insulating layer 12, and the HSG silicon layer 20. The lower capacitor electrode 16 and the HSG silicon layer 22 can thus be doped as shown in FIG. 5. More particularly, the implant energy can be approximately 70 kV and the implant dose can be on the order of $10^{16}$ ions/cm$^2$.

As discussed above, the lower capacitor electrode and the HSG silicon layer can be doped simultaneously using an ion implant. The HSG silicon layer, however, may be damaged by the ion implant so that the quality of the HSG silicon layer on the sides of the lower capacitor electrode 16 may be lower than that on the top of the lower electrodes.

SUMMARY OF THE INVENTION

It is therefore an object of the present invention to provide improved methods of forming doped layers for integrated circuit devices.

It is another object of the present invention to provide methods of forming improved capacitors for integrated circuit devices.

It is still another object of the present invention to provide methods of forming integrated circuit memory devices having improved performance.

These and other objects are provided according to the present invention by methods including the steps of forming a layer of a semiconductor material on an integrated circuit substrate, and annealing the layer of the semiconductor material at a predetermined temperature while flowing a dopant gas over the layer of the semiconductor material. More particularly, the step of forming the layer of the semiconductor material can include the steps of forming a first sublayer of a semiconductor material on the integrated circuit substrate and forming a second sublayer of the semiconductor material on the first sublayer wherein the second sublayer has an increased surface area. By increasing the surface area of the layer, the layer can be used to provide a capacitor electrode having increased capacitance. Moreover, by doping the second sublayer using the annealing step discussed above, the resistance thereof can be decreased thereby decreasing a Cmin/Cmax ratio for a capacitor formed using the layer of the semiconductor material.

More particularly, the second sublayer can be a hemispherical grained (HSG) silicon layer, and the step of forming the second sublayer can include forming hemispherical grained silicon seeds on the first sublayer and growing the hemispherical grained silicon seeds to form the hemispherical grained silicon layer. The second sublayer can be formed selectively on the first sublayer, or the second sublayer can be formed across the first sublayer and on exposed portions of the integrated circuit substrate.

The dopant gas can be phosphine or arsine, and the dopant gas can also include a carrier gas such as nitrogen, helium, or argon. Moreover, the steps of forming the layer of the semiconductor material and annealing the layer can be performed in-situ in a common reaction chamber. The annealing step can be performed at a predetermined temperature in the range of 560° C. to 630° C. for a predetermined period of time in the range of one minute to ten minutes. The dopant gas can flow at a rate in the range of 1 sccm to 250 sccm.

In addition, the annealing step can be followed by the steps of forming a dielectric layer on the layer of the semiconductor material, and forming a conductive layer on the dielectric layer opposite the layer of the semiconductor material. Moreover, the step of forming the layer of the semiconductor material can be preceded by the steps of forming a memory cell transistor on the integrated circuit substrate, and forming an insulating layer on the integrated circuit substrate and on the memory cell transistor. This insulating layer has a contact hole therein exposing a source/drain region of the memory cell transistor and the layer of the semiconductor material is formed on the insulating layer and adjacent the contact hole so that the layer of the semiconductor material is electrically coupled with the source/drain region through the contact hole. Accordingly, the methods of the present invention can be used to provide improved memory cell capacitors.

According to the methods of the present invention, memory cell capacitors having an increased Cmin/Cmax ratio can be provided thereby increasing the performance of the memory cell capacitor and the memory device including the memory cell capacitor.

DETAILED DESCRIPTION

Figure 1:
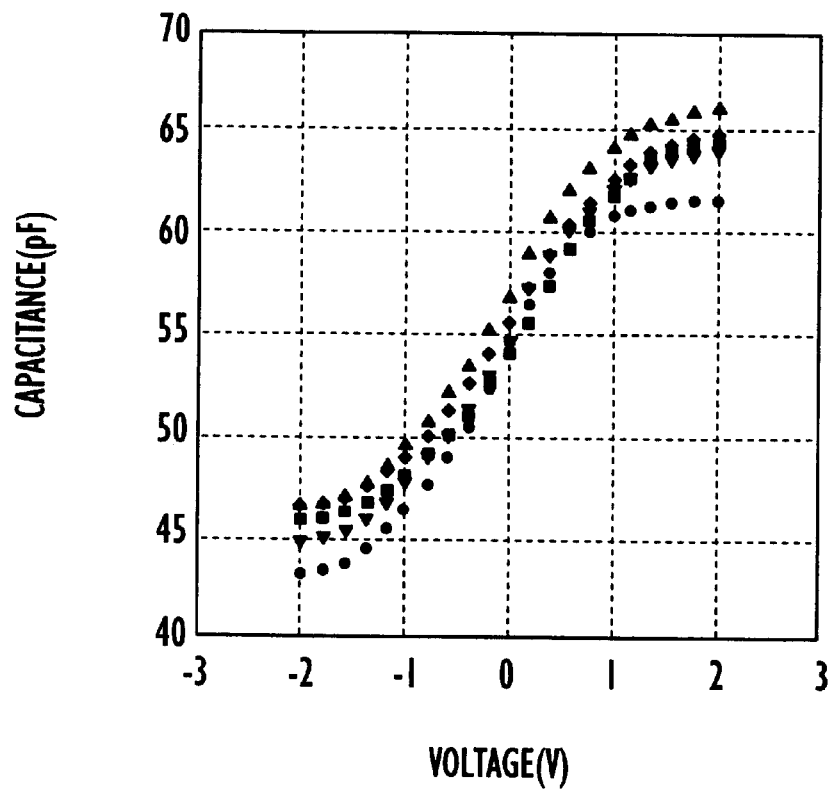
FIG. 1 is a graph illustrating voltage-capacitance variations for capacitors formed according to the prior art.
Figure 2:
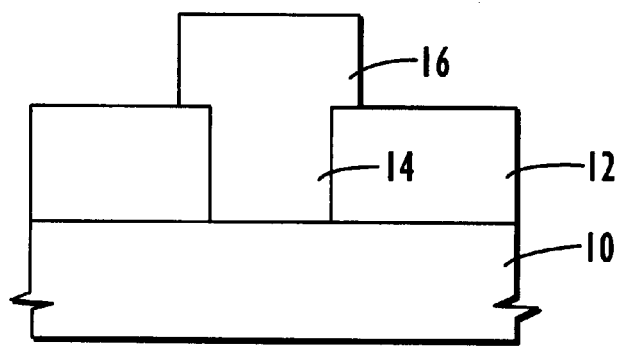
FIGS. 2–5 are cross-sectional views illustrating steps of a method for forming a hemispherical grained silicon layer according to the prior art.
Figure 3:
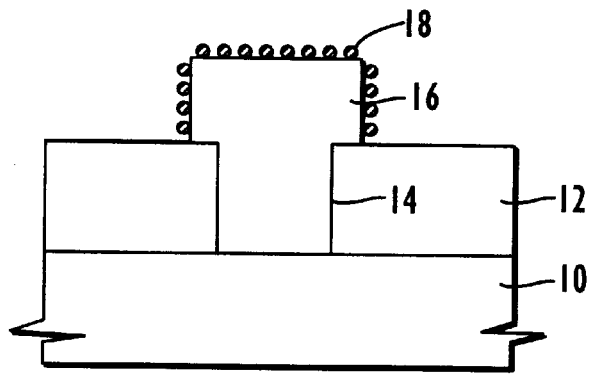
Figure 4:
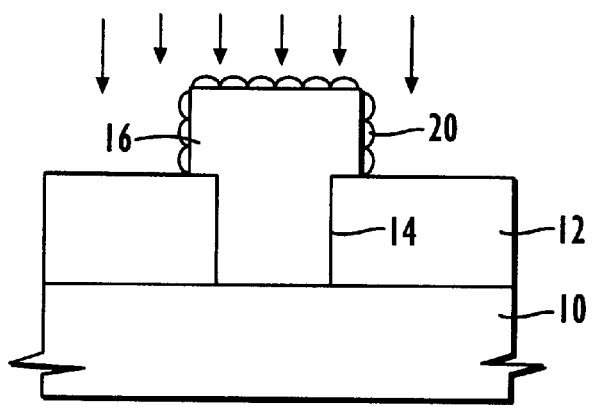
Figure 5:
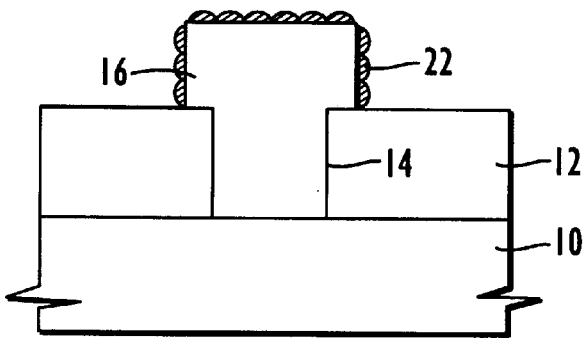

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 6:
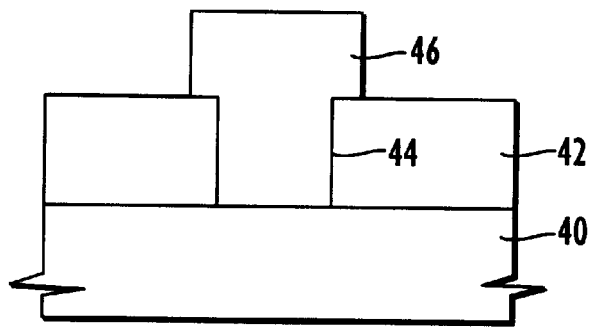
FIGS. 6–8 are cross-sectional views illustrating steps of a method for forming a hemispherical grained silicon layer according to the present invention.

The formation of integrated circuit devices including hemispherical grained (HSG) silicon layers according to the present invention will now be discussed with reference to FIGS. 6–8. In particular, a memory cell transistor can be formed on a substrate 40, and an insulating layer 42 can be formed on the memory cell transistor and on the substrate 40. A contact hole can be formed in the insulating layer 42 by forming a photoresist mask on the insulating layer 42 and selectively etching portions of the insulating layer 42 exposed through the photoresist mask. Moreover, the contact hole 44 can expose a source/drain region of the memory cell transistor, and an anisotropic etch can be used to form the contact hole 44.

A conductive layer is then formed on the surface of the insulating layer 42, and this conductive layer is coupled to the semiconductor substrate 40 through the contact hole 44. The conductive layer is then patterned using photolithographic and etch steps to provide a first sub-layer 46 of the lower capacitor electrode coupled to the semiconductor substrate 40 through the contact hole 44 as shown in FIG. 6. Moreover, the conductive layer, and thus the first sub-layer 46, can be formed from doped polysilicon or doped amorphous silicon.

Figure 7:
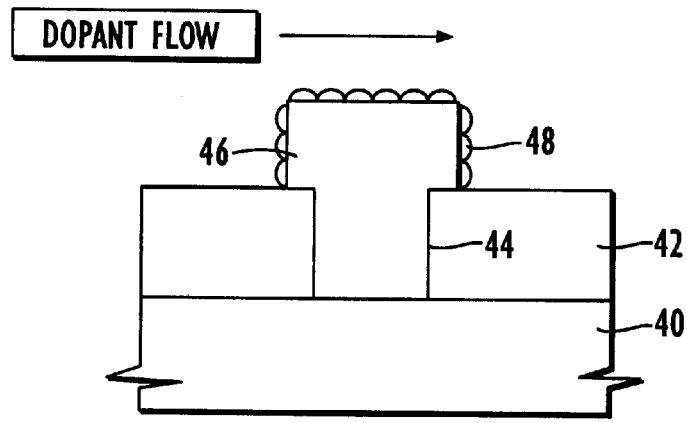

The surface area of the lower capacitor electrode can be increased as shown in FIG. 7. A second sub-layer 48 having a roughened surface, such as a hemispherical grained (HSG) silicon layer, is provided to increase the surface area of the lower capacitor electrode. In particular, hemispherical grained (HSG) silicon seeds can be formed on the surface of the first sub-layer 46 using either silane ($SiH_4$) or disilane ($Si_2H_6$). The HSG seeds are then grown by thermally treating the lower capacitor electrode to form the HSG silicon layer on the first sub-layer 46. The surface area of the lower capacitor electrode can thus be increased. The second sub-layer 48 can be formed by a selective HSG silicon formation technique, or the second sub-layer 48 can be formed by a blanket HSG silicon formation technique wherein the HSG silicon layer is formed on the first sub-layer 46 as well as the insulating layer 42 and then removed from the insulating layer 42.

At this point, the second sub-layer 48 can be undoped. The second sub-layer 48, however, is preferably doped with the same dopant used to dope the first sub-layer 46. For example, it is preferable to dope the second sub-layer 48 with phosphorous if the first sub-layer 46 is doped with phosphorous. In particular, the second sub-layer 48 can be doped by flowing a dopant gas over the second sub-layer at a predetermined flow rate while annealing the second sub-layer 48 for a predetermined time and at a predetermined temperature. For example, the annealing step can be performed at a temperature in the range of 560° C. to 630° C. while flowing the dopant gas for a period of time in the range of one to ten minutes. The dopant gas may be a gas including $PH_3$ or $AsH_3$. In addition, it may be desirable to provide a carrier gas such as nitrogen ($N_2$), helium (He), or argon (Ar) with the dopant gas. Other gases may also be used.

The annealing time should be determined so as not to significantly influence the production yield of the integrated circuit device. In particular, the annealing step is preferably performed for at least one minute and more preferably for a period of time between one and ten minutes. Moreover, the dopant gas can flow at a rate of at least 1 sccm and preferably at a rate in the range of 1 sccm to 250 sccm.

Figure 8:
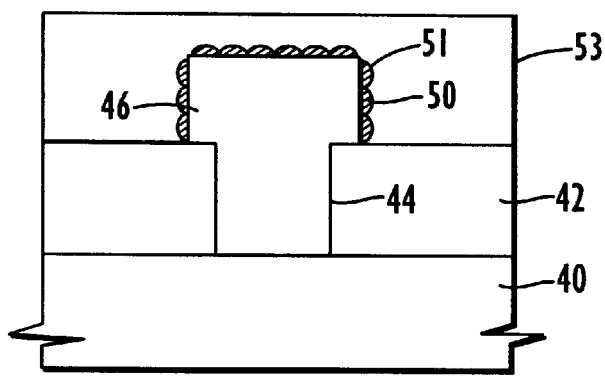

The doped second sub-layer 50, such as a doped HSG silicon layer, is illustrated in FIG. 8. As discussed above, the doped HSG silicon layer is preferably doped with the same dopant used to dope the first electrode sublayer 46. The dopant concentration of the HSG silicon layer can be controlled by controlling the flow rate of the dopant gas and the annealing time during which the dopant gas flows. Furthermore, a dielectric layer 51 can be formed on the second sub-layer 50, and a conductive layer 53 can be formed on the dielectric layer 51 as shown in FIG. 8.

Figure 9:
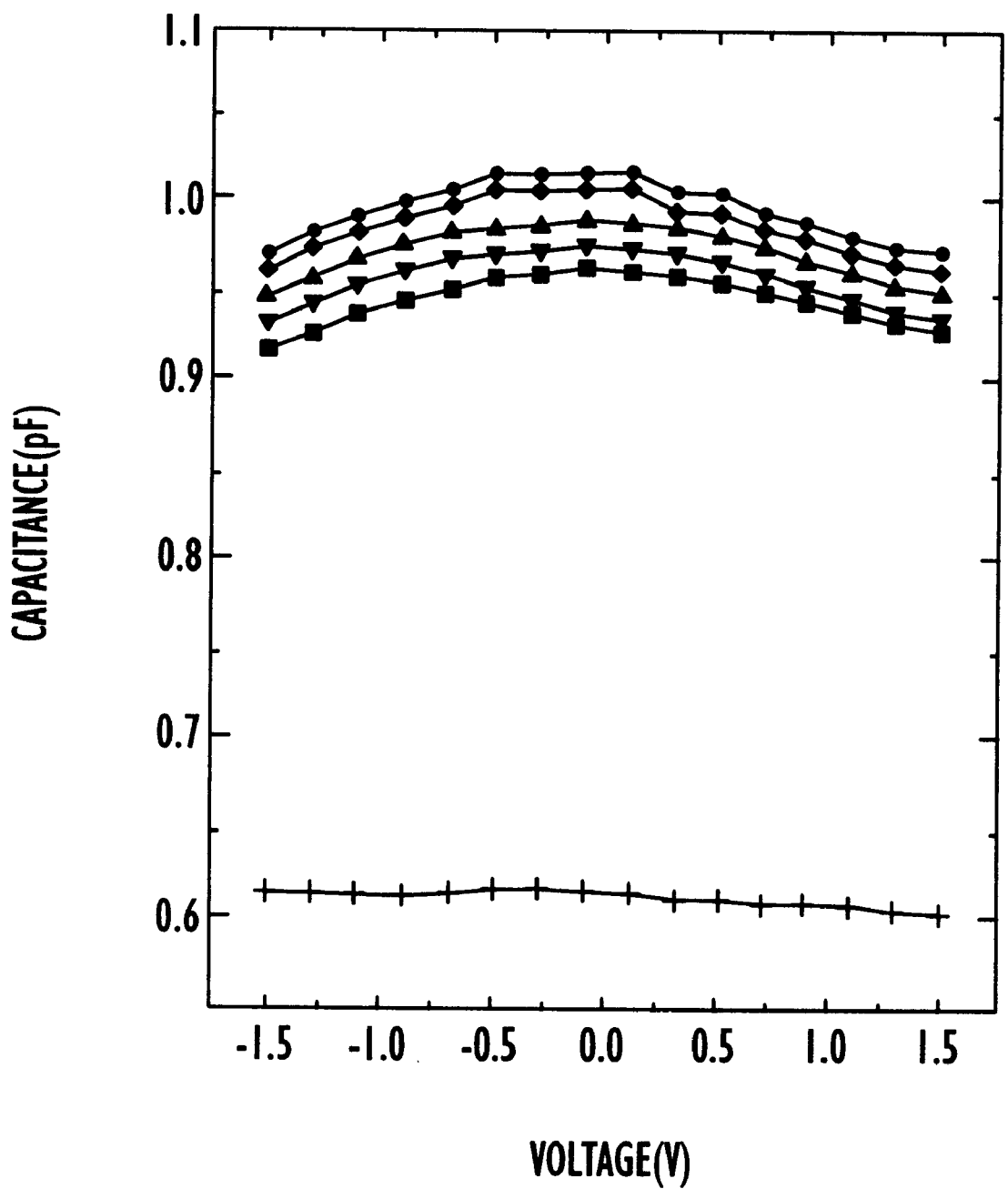
FIG. 9 is a graph illustrating voltage-capacitance variations for a capacitor formed according to the present invention.

As shown in FIG. 9, HSG silicon layers doped by out-diffusion according to the present invention can be used to provide capacitors having a reduced difference between the maximum (Cmax) and minimum (Cmin) capacitances. In FIG. 9, the reference symbols ●, ■, ▲, ▼, and ♦ indicate the capacitances respectively measured at the top, center, bottom, left, and right portions of the capacitor formed according to the present invention. As shown, the capacitance is highest at the center of the capacitor, while the capacitance is lowest at the bottom of the capacitor. As further shown, progressively lower capacitances are obtained by measuring at the center, right, bottom, left, and then top of the capacitor. A minimum capacitance Cmin of between 0.9 pF and 1.0 pF can be obtained at any portion of the capacitor with an applied voltage of between −1.5 V and +1.5 V. A maximum capacitance Cmax of only slightly more than 1.0 pF can be obtained with an applied voltage of between 0.0 V and −0.5 V. A Cmin/Cmax ratio of at least 0.9 can thus be obtained thereby providing stable capacitor operation.

In FIG. 9, the reference symbol "+−" indicates a capacitance variation of a capacitor without an HSG silicon layer on the storage node. Here, the capacitance is a little higher than 0.6 pF which is significantly lower than that of a capacitor having a HSG silicon film on the lower capacitor electrode.

As discussed above, a hemispherical grained (HSG) silicon layer can be formed and then doped by flowing a dopant gas across the HSG silicon layer while annealing the silicon layer. The dopant concentrations of the upper and lower electrodes can thus be increased thereby increasing the Cmin value and allowing a Cmin/Cmax ratio of 0.9 or greater to be obtained. Stable capacitor operations can thus be provided thereby increasing the operational reliability of an integrated circuit device including the capacitor thus formed. The performance of dynamic random access memory devices including capacitors formed according to the present invention can thus be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. The method of doping a surface portion of a layer of an integrated circuit device comprising the steps of:

forming a layer of a semiconductor material on an integrated circuit substrate;

forming hemispherical grained silicon seeds on said layer of said semiconductor material;

growing said hemispherical grained silicon seeds to form a hemispherical grained silicon layer; and after growing said hemispherical grained silicon seeds, annealing said hemispherical grained silicon layer at a predetermined temperature while flowing a dopant gas over said hemispherical grained silicon layer at a predetermined flow rate thereby increasing a dopant concentration of said hemispherical grained silicon layer.

2. The method according to claim 1 wherein said step of forming said hemispherical grained silicon seeds comprises selectively forming said hemispherical grained silicon seeds on said layer of said semiconductor material.

3. The method according to claim 1 wherein said step of forming said hemispherical grained silicon seeds comprises forming said hemispherical grained silicon seeds on said layer of said semiconductor material and on exposed portions of said integrated circuit substrate.

4. The method according to claim 1 wherein said dopant gas comprises a gas chosen from the group consisting of phosphine ($PH_3$) and arsine ($AsH_3$).

5. The method according to claim 4 wherein said dopant gas further comprises a carrier gas chosen from the group consisting of nitrogen, helium, and argon.

6. The method according to claim 1 wherein said forming and annealing steps are performed in situ in a common reaction chamber.

7. The method according to claim 1 wherein said predetermined temperature is in the range of 560° C. and 630° C.

8. The method according to claim 7 wherein said annealing step is performed for a predetermined period of time in the range of 1 minute to 10 minutes.

9. The method according to claim 1 wherein said dopant gas flows at a rate in the range of 1 sccm to 250 sccm.

10. The method according to claim 1 wherein said annealing step is followed by the steps of:

forming a dielectric layer on said layer of said semiconductor material; and forming a conductive layer on said dielectric layer opposite said layer of said semiconductor material.

11. The method according to claim 10 wherein said step of forming said layer of said semiconductor material is preceded by the steps of:

forming a memory cell transistor on said integrated circuit substrate; and forming an insulating layer on said integrated circuit substrate and on said memory cell transistor wherein said insulating layer has a contact hole therein exposing a source/drain region of said memory cell transistor, and wherein said layer of said semiconductor material is formed on said insulating layer and adjacent said contact hole so that said layer of said semiconductor material is electrically coupled with said source/drain region through said contact hole.

12. The method of forming an integrated circuit memory device comprising the steps of:

forming a memory cell transistor on said integrated circuit substrate; and forming an insulating layer on said integrated circuit substrate and on said memory cell transistor wherein said insulating layer has a contact hole therein exposing a source/drain region of said memory cell transistor;

forming a layer of a semiconductor material on said insulating layer and adjacent said contact hole so that said layer of said semiconductor material is electrically coupled with said source/drain region through said contact hole;

forming hemispherical grained silicon seeds on said layer of said semiconductor material;

growing said hemispherical grained silicon seeds to form a hemispherical grained silicon layer; and after growing said hemispherical grained silicon seeds, annealing said hemispherical grained silicon layer at a predetermined temperature while flowing a dopant gas over said hemispherical grained silicon layer at a predetermined flow rate thereby increasing a dopant concentration of said hemispherical grained silicon layer.

13. The method according to claim 12 wherein said step of forming said hemispherical grained silicon seeds comprises selectively forming said hemispherical grained silicon seeds on said layer of said semiconductor material.

14. The method according to claim 12 wherein said step of forming said hemispherical grained silicon seeds comprises forming said hemispherical grained silicon seeds on said layer of said semiconductor material and on exposed portions of said integrated circuit substrate.

15. The method according to claim 12 wherein said dopant gas comprises a gas chosen from the group consisting of phosphine ($PH_3$) and arsine ($AsH_3$).

16. The method according to claim 15 wherein said dopant gas further comprises a carrier gas chosen from the group consisting of nitrogen, helium, and argon.

17. The method according to claim 12 wherein said forming and annealing steps are performed in situ in a common reaction chamber.

18. The method according to claim 12 wherein said predetermined temperature is in the range of 560° C. and 630° C.

19. The method according to claim 12 wherein said annealing step is performed for a predetermined period of time in the range of 1 minute to 10 minutes.

20. The method according to claim 12 wherein said dopant gas flows at a rate in the range of 1 sccm to 250 sccm.

21. The method according to claim 12 wherein said annealing step is followed by the steps of:

forming a dielectric layer on said hemispherical grained silicon layer opposite said substrate; and forming a conductive layer on said dielectric layer opposite said hemispherical grained silicon layer.

* * * * *

UNITED STATES PATENT AND TRADEMARK OFFICE
CERTIFICATE OF CORRECTION

PATENT NO. : 5,943,584
DATED : August 24, 1999
INVENTOR(S) : Shim et al.

It is certified that error appears in the above-identified patent and that said Letters Patent is hereby corrected as shown below:

Column 6, line 20, delete "The" and insert - - A - -.

Column 7, line 12, delete "The" and insert - - A - -.

Column 8, line 22, delete "12" and insert - - 18 - -.

Signed and Sealed this

Seventh Day of November, 2000

Attest:

Q. TODD DICKINSON

Attesting Officer

Director of Patents and Trademarks